United States Patent [19]

Liu et al.

[11] Patent Number: 5,260,225
[45] Date of Patent: Nov. 9, 1993

[54] INTEGRATED INFRARED SENSITIVE BOLOMETERS

[75] Inventors: Michael S. Liu, Bloomington; Jeffrey S. Haviland, Plymouth; Cheisan J. Yue, Roseville, all of Minn.

[73] Assignee: Honeywell Inc., Minneapolis, Minn.

[21] Appl. No.: 973,606

[22] Filed: Nov. 9, 1992

Related U.S. Application Data

[63] Continuation of Ser. No. 810,974, Dec. 20, 1991, abandoned.

[51] Int. Cl.$^5$ .............................................. H01L 3/18
[52] U.S. Cl. ........................................ 437/3; 437/974; 250/338.4; 250/332; 250/371
[58] Field of Search ......................... 437/3, 4, 974; 250/338.4, 332, 371, 370.14

[56] References Cited

U.S. PATENT DOCUMENTS

| | | | |
|---|---|---|---|
| 4,570,329 | 2/1986 | Paine et al. | 437/3 |
| 4,574,263 | 4/1986 | Liddiard . | |
| 4,665,610 | 5/1987 | Barth . | |
| 4,724,356 | 2/1988 | Daechler . | |
| 4,766,666 | 8/1988 | Sugiyama et al. . | |
| 4,853,669 | 8/1989 | Guckel et al. . | |
| 4,922,116 | 5/1990 | Grinberg et al. . | |
| 4,948,741 | 8/1990 | Hammond et al. | 437/4 |
| 4,965,212 | 10/1990 | Aktik | 437/4 |
| 5,010,251 | 4/1991 | Grinberg et al. | 250/332 |
| 5,021,663 | 6/1991 | Hornbeck | 250/338.4 |
| 5,059,543 | 10/1991 | Wise et al. | 437/3 |

FOREIGN PATENT DOCUMENTS

62-142372 6/1987 Japan .

OTHER PUBLICATIONS

Boninsfgni, et al. "Low-Temperature Bolometer Array," Rev. Sci. Instrum. vol. 60, No. 4 Apr. 1989, pp. 661-665.

*Primary Examiner*—Brian E. Hearn
*Assistant Examiner*—Kevin M. Picardat
*Attorney, Agent, or Firm*—Gregory A. Bruns

[57] ABSTRACT

A method for fabricating an integrated infrared sensitive bolometer having a polycrystalline element whereby an oxide region deposited on silicon nitride covered with a first polysilicon layer which is etched to provide a location for a bolometer element. A second polysilicon layer is deposited and doped to achieve a desired temperature coefficient of resistivity of 1 to 2%/°C. The second polysilicon layer forms an IR sensitive element over the oxide region. Openings are etched in the IR sensitive element to permit an etchant to remove the oxide region resulting in the sensitive element being suspended over a cavity.

10 Claims, 4 Drawing Sheets

TCR OF A SERIES OF POLYCRYSTALLINE
SILICON OF VARIOUS IMPLANT DOSE

TEMPERATURE DEPENDENCE OF A POLYSILICON RESISTOR

BARRIER HEIGHT OF POLYSILICON
AS A FUNCTION OF IMPLANT DOSES

RELATIONSHIP BETWEEN TCR'S AND
THE BARRRIER HEIGHTS

INTEGRATED INFRARED SENSITIVE BOLOMETERS

This application is a continuation of application Ser. No. 07/810,974, filed Dec. 20, 1991, now abandoned.

BACKGROUND OF THE INVENTION

The invention disclosed herein relates generally to detectors for detecting thermal radiation and particularly to the class of detectors where the energy of the absorbed radiation raises the temperature of the detecting element and as a result changes the properties of the detector. Bolometers are resistive elements fabricated from a material having a large temperature coefficient so that the absorbed radiation changes the value of electrical resistance.

In the past bolometers have typically used infrared sensitive thin film materials which are not normally used in integrated circuits such as permalloy. The use of materials such as permalloy complicates the fabrication of bolometers in that numerous completely independent masks are required for the underlying integrated circuits and for the bolometer element and interconnection.

Thus, a need exists for a method of making an integrated infrared sensitive bolometer element from a material that is also typically used in integrated circuits.

SUMMARY OF THE INVENTION

The present invention solves these and other needs by providing a method for fabricating an infrared sensitive bolometer. An oxide layer is deposited on an insulating layer over a silicon substrate. The oxide layer is masked and etched to form a remaining oxide region. A first polysilicon layer is deposited and etched at said remaining oxide region to define a location for a bolometer element. A second polysilicon layer is deposited and doped to achieve a predetermined temperature coefficient of resistivity (TCR). The second layer of polysilicon is etched to provide openings at the remaining oxide region. The remaining oxide region is etched away with etchant introduced through openings in the second polysilicon layer. The resulting structure is a thin membrane of second polysilicon. This membrane has small thermal conductance so that the thermal time constant is low. The resistance has a high TCR and the responsivity which is inversely proportional to thermal conductivity is high. When the membrane is biased at a given current the absorbed infrared energy will heat the membrane to produce a change of resistance and the resulting signal of the current times the change of resistance is sensed by circuitry in the silicon substrate.

DESCRIPTION OF THE PREFERRED EMBODIMENT

Figure 1:
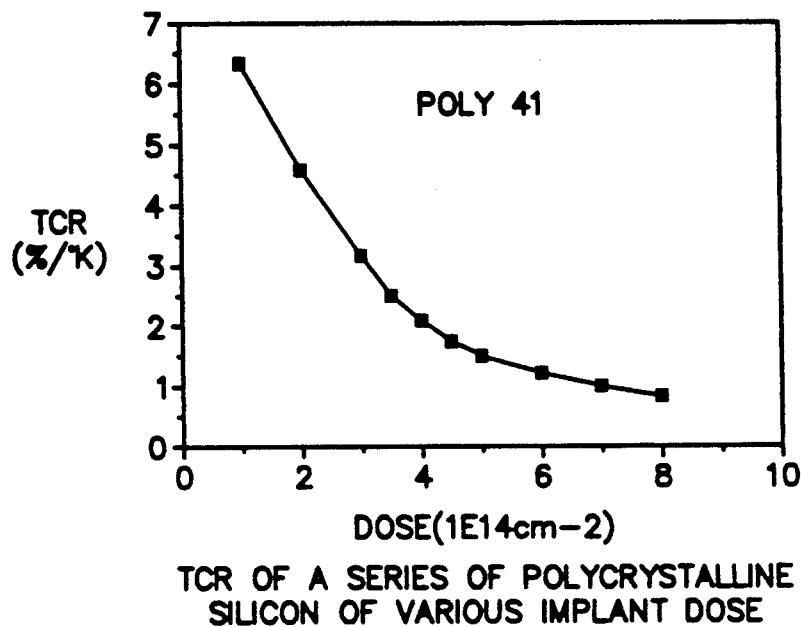
FIG. 1 is a plot of the temperature coefficient of resistance of several polysilicon samples as a function of the implant dose of arsenic.

In order to evaluate a material for use as an infrared detector, one must know the responsivity and noise of the detector. To analyze the responsivity, let $P_o + P_1 exp(j\omega t)$ be the modulated radiation received by a bolometer of area A and let $\Delta T$ be the temperature difference caused by this modulation. Then the thermal properties of the detector not including the unmodulated self-heating term, can be described by the equation:

$$H(d\Delta T/dt) + G\Delta T = \eta[P_o + P_1 exp(j\omega t)] \quad (1)$$

where H is the heat capacity in W-sec/°K, G the thermal conductance in W/°K, either caused by a true heat conductance or by the exchange of radiation between the detector and the environment, $\eta$ the fraction of the incident power that is converted into heat and $\omega$ the modulation frequency of the incident radiation.

Substituting $\Delta T = T_o exp(j\omega t)$ gives $$\Delta T_o = \eta P_1/(G + j\omega H) \quad (2)$$

The incoming radiation gives rise to a signal voltage $\Delta V$ when the resistor is biased with a current flow I, where $\Delta V = I\Delta R$ (3). Relating this to TCR=$\alpha$, we have $\Delta R = \alpha R\Delta T$ and $\Delta V = IR[\alpha\eta P_1/(G + j\omega H)]$ (4) so that the voltage responsivity is given in volt/watt by $R_v = (\Delta V/P_1) = |IR\alpha\eta/(G + j\omega H)|$ (5). Where it is more convenient to use current responsivity, it is given by $R_i = (\Delta V/P_1)/R = |I\alpha\eta/(G + j\omega H)|$ (6). From equation (5), IR is the voltage drop across the bolometer, $(G + j\omega H)$ is the characteristic of the bolometer thermal property, and $\eta$ is the absorption characteristics of the bolometer. The IR drop is limited by the power supply and in most cases this will be 5 V for ICs. The thermal peroperty $(G + j\omega H)$ has to be small to achieve a high responsivity. The effective way to make this term small is by using a suspended bridge of IR sensitive material supported by a low thermal conductivity material. Silicon nitride that is nearly stress free has been used as the low thermal conductivity material. After the consideration for this thermal property just described, the material sensitivity for a bolometer is largely determined by the temperature coefficient of resistance (TCR) of the element with a large TCR being desirable. The literature shows that few materials having TCR values larger than 1 percent per degree. To estimate how well a polysilicon resistor element would perform as far as the signal is concerned we will calculate assuming the resistor was put on thermal isolation with a small thermal mass. The maximum signal would be obtained when $G >> \omega H$, in other words, thermal time constant H/G is short. Assume $\eta = 0.5$, detector area of $1 \times 10^{-5}$ cm$^{-2}$, layer thickness of 500 Å, and using typical thermal conductance of about $3 \times 10^{-6}$ W/°K, we have thermal time constant of 27 $\mu s$, voltage responsivity of about 8300 V/W. Assume further that the resistance of the detector is 100 K Ohms and the bias is from 5 V supply, so that the bias current is 50 $\mu A$ and thus current responsivity is about 0.085 A/W. This completes the discussion of responsivity.

The next consideration is the noise property of the element and the electronics used to process the signal. To realize the usefulness of a polysilicon element, it is necessary to have a large signal-to-noise ratio. Since the TCR of the polysilicon resistor is determined by the barrier behavior as discussed hereafter, it is expected that some 1/f noise will exist and the extent of this noise will depend on the specific technology used to implement the electronics portion. Detailed analysis can be done to optimize the design. For now we will assume the design will be perfect and the noise will be determined by the bolometer only. This is a reasonable assumption and generally can be met by design in practice.

With this assumption, only two noise sources will be operative, the bolometer noise and the temperature fluctuation noise. Here we will switch to a current noise expression for convenience. The noise current, $i_n$, can be expressed as $$\overline{i_n^2} = 4kT(g_n + TGR_i^2), \quad (7)$$

where k is Boltzmans constant, T is absolute temperature, $g_n$ is the equivalent noise conductance of the bolometer and the term $TGR_i^2$ is the equivalent noise conductance of the temperature fluctuation, which is normally smaller than $g_n$. At the practical limit, the equivalent noise conductance would be approaching thermal noise. Even when some 1/f noise is present, a good design of material would normally be within a factor of 2 from the thermal noise limit. We will calculate the detectivity, the measurement of how good the detector would behave, for this condition with our current polysilicon resistor. The detectivity, normally expressed in D*, is given as $$D^* = R_i \sqrt{A}/\sqrt{(i_n^2)}, \text{ cm}\sqrt{(Hz)}/W \quad (8)$$

At room temperature, TCR=0.01/°K, we have D* $\approx 1.0 \times 10^9$ cm$\sqrt{(Hz)}$/W. It should be noted that some improvement (within a factor of 3) is possible depending on the choice of resistance for the polysilicon element and its noise property. The theoretical limit of the detectivity is $2 \times 10^{10}$ cm$\sqrt{(Hz)}$/W. Generally $10^9$ cm$\sqrt{(Hz)}$/W is regarded to be good for bolometers. It therefore appears that good performance may be expected for the polysilicon element bolometer of the present invention.

For uncooled infrared detector applications, the sensitivity of the detector is proportional to the temperature coefficient of resistance (TCR) of the IR sensitive element. After the preceding analysis was made, certain experiments were conducted to further verify the suitability of polysilicon as a bolometer element. An evaluation of the TCR near room temperature was made of several polysilicon samples doped with various implant doses of arsenic at an energy of 60 Kev and then subjected to a series of temperature cycles of less than 925° C. Following these temperature cycles, the evaluation involved the measurement of the change of resistance R between temperature T1 and T2 near the temperature T=0.5(T1+T2) so that TCR(T)=($\Delta$R/R)/ T. These measurements were performed in a temperature control chuck and special care was taken with the voltage probe since high impedance was experienced with some samples. The measurement setup used simple 4 point probes. The results of these measurements are shown in FIG. 1 for an arsenic implant dose ranging from 1E14cm$^{-2}$ to 8E14cm$^{-2}$ show that the TCR varies from 0.9%/°C. to 6%/°C. with the highest measured TCR occurring at the lowest implant dose. It can be shown that the theoretical limit of the TCR is about 7%/°C. at room temperature.

Figure 2:
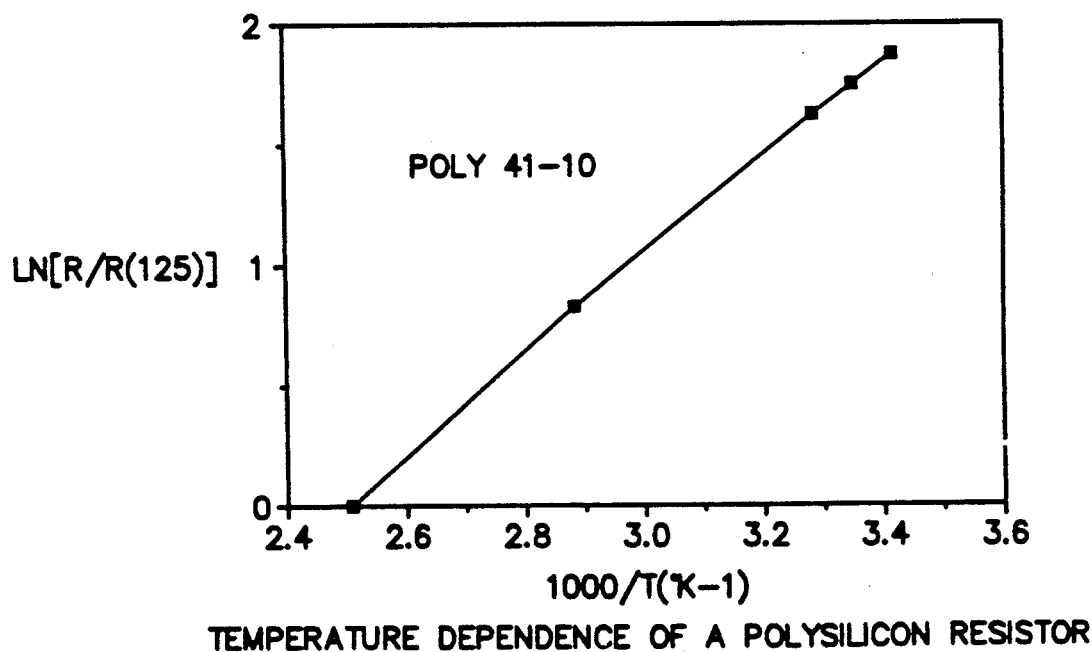
FIG. 2 is a plot of the temperature dependence of a polysilicon resistor.

Next the barrier height Eb which is believed to govern the resistivity and TCR of polysilicon was investigated. Eb was measured by measuring the temperature dependence of the resistivity of a sample of polysilicon having an arsenic implant dose of 4E14cm$^{-2}$ over a temperature range of 20° C. to 125° C. The data were normalized to the value at 125° C. and transformed into natural logarithmic values. The independent variable was transformed into 1000/T, where T is the absolute temperature. The results are shown in FIG. 2. The barrier height information is contained in the slope.

Figure 3:
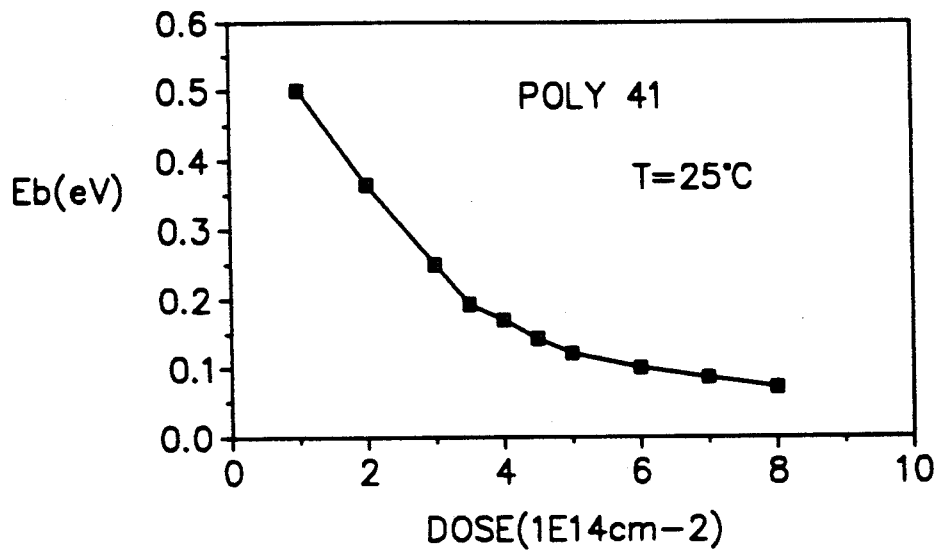
FIG. 3 is a plot of the barrier height of a polysilicon sample as a function of the implant dose.

All the samples were then evaluated for barrier height by following the same procedure and the results are shown in FIG. 3. The barrier heights vary from 0.08 eV to 0.5 eV. The limit for barrier height is 0.55 eV which is one half of the bandgap of silicon. For that value the TCR would be 7.7%/ C at room temperature.

Figure 4:
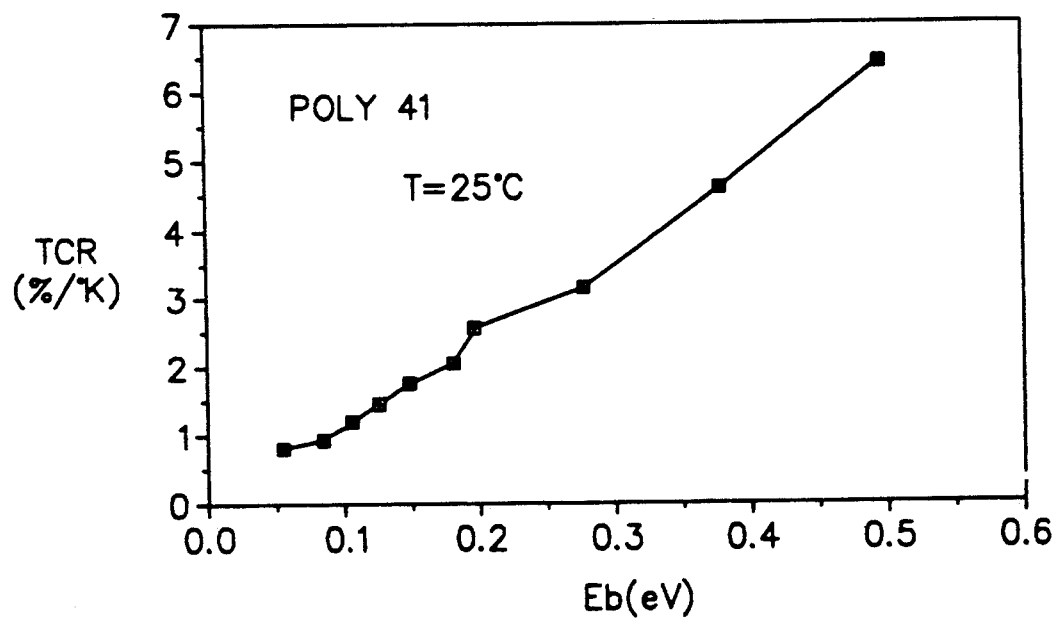
FIG. 4 is a plot of the temperature coefficient of resistance as a function of barrier height.

The TCR has been shown to be related to the barrier height. These have been plotted in FIG. 4.

A single IR sensitive polysilicon bolometer element in accordance with the present invention is shown in the drawings and generally designated 10.

Figure 6:
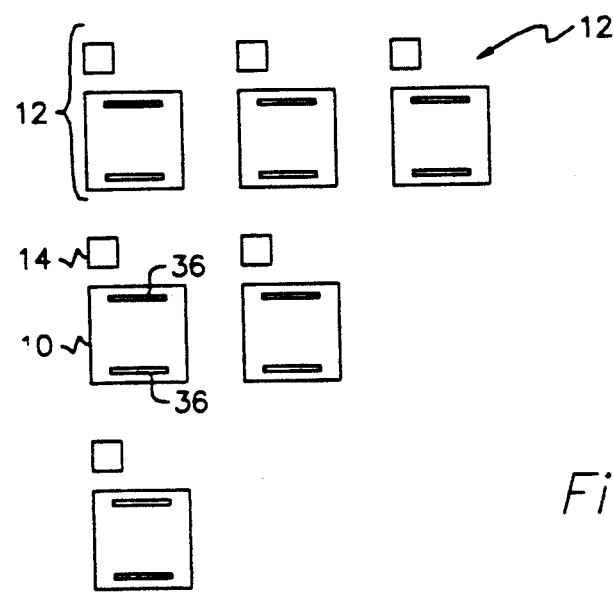
FIG. 6 is a simplified plan view of an array of the infrared sensitive bolometer of the present invention.

A portion of an IR detection array as shown in FIG. 6 is divided into a matrix of pixel cells 12 with the output of each pixel individually controlled by an integrated circuit 14. The IR array will typically be laid out as a 256×256 array or other convenient size array. A multiplex arrangement is interconnected with integrated circuit 14 so that the output of each pixel may be controlled for display purposes. Each pixel cell includes a polysilicon resistor 10 which is the actual IR detection element and supporting electronics in the form of IC 14.

Figure 5A:
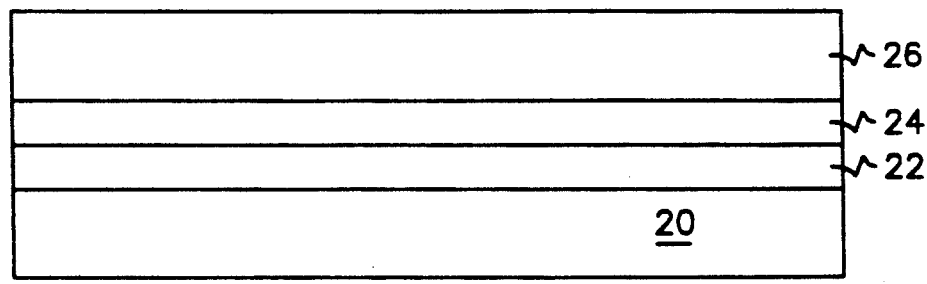
FIGS. 5a through 5e are cross-sectional views of an infrared sensitive bolometer element showing process steps in accordance with the present invention.

FIG. 5a illustrates a portion of a semiconductor device to be used in the process of the present invention.

Shown in FIG. 5a is a silicon substrate 20 having an oxide layer 22. A silicon nitride layer 24 is deposited by CVD on oxide layer 22. The purpose of layer 24 is to serve as an etch stop in a later process step.

Oxide layer 26 is deposited on silicon nitride layer 24 by CVD. The thickness of oxide layer 26 will determine the depth of a cavity to be formed in a later process step. Oxide layer 26 is deposited on silicon nitride layer 24 by CVD.

Figure 5B:
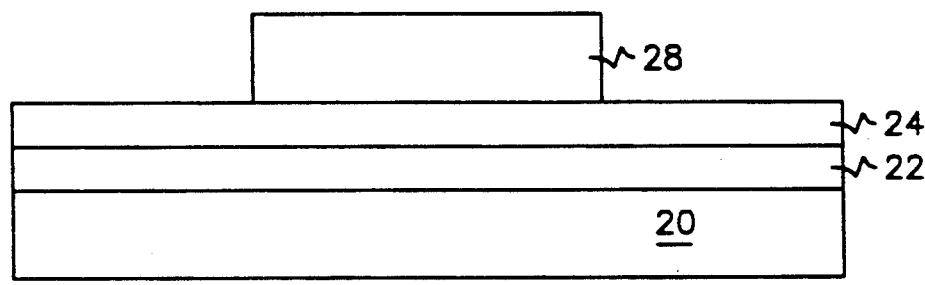

Oxide layer 26 is etched using known masking and etching procedures to provide an oxide region 28 as shown in FIG. 5b. The etching of oxide layer 26 to provide oxide region 28 may be designed to also be used in the formation of IC 14.

Figure 5C:
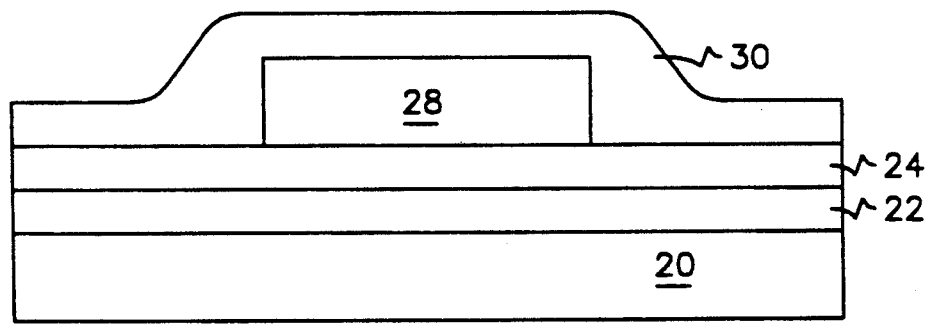
Figure 5D:
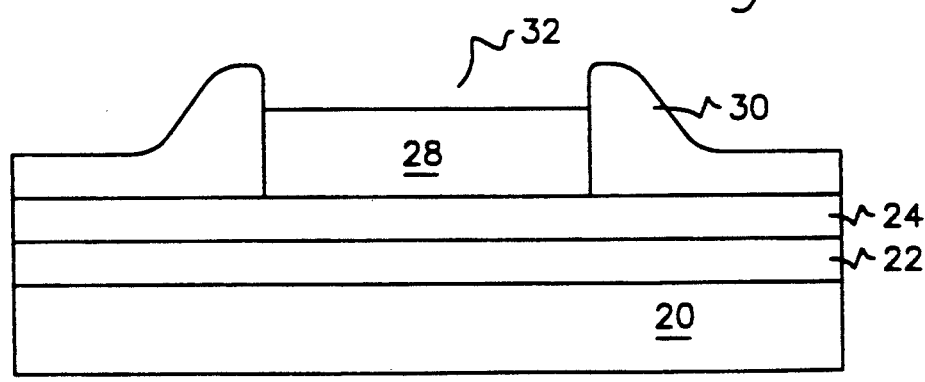
Figure 5D:
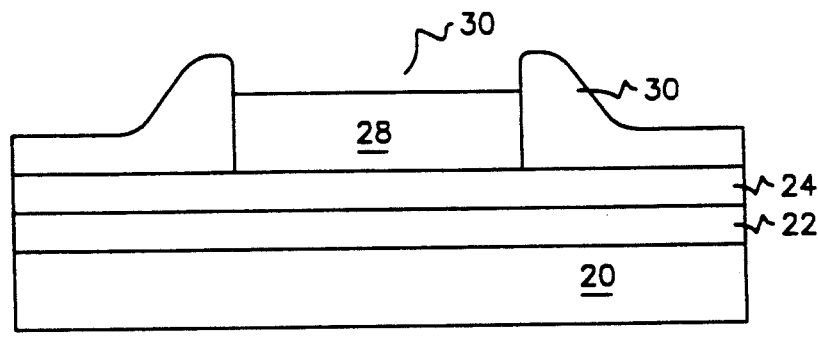

A first polysilicon layer 30 is deposited by CVD as shown in FIG. 5c. Polysilicon 30 is then masked and etched to provide a location 32 for IR sensitive element 10 of bolometer. The etching of polysilicon 30 should extend slightly into oxide layer 28.

Following the etching of location 32, a second polysilicon layer 34 is deposited. A typical thickness of polysilicon 34 is 1000 to 5000 angstroms. Polysilicon 34 is then doped by ion implantation of arsenic, phosphorous or boron to achieve a desired TCR.

A third mask is then required in order to etch to define sensitive element 10 and to etch openings 36 in element 10. Openings 36 are shown as slots but may be other type openings. An etchant is then used to etch away oxide region 28 so that a doped polysilicon resistor is suspended over the cavity created when oxide region 28 is removed.

Figure 5E:
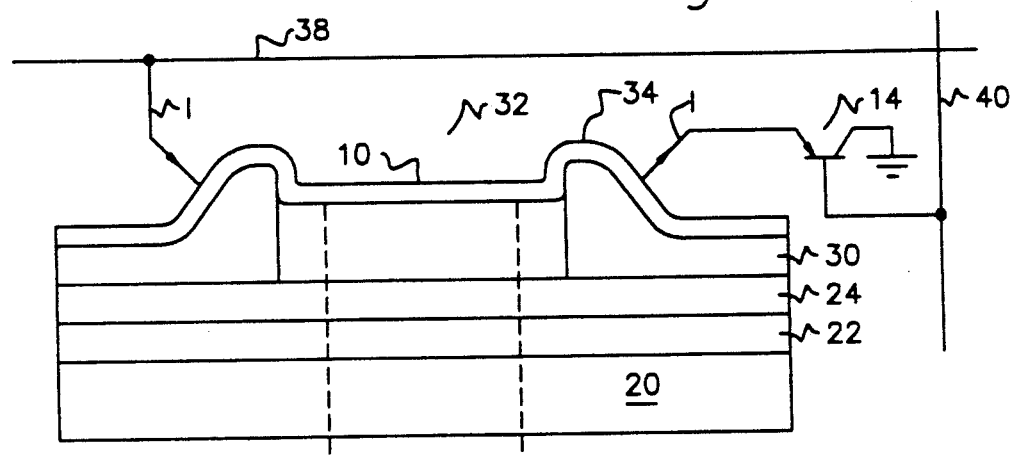
Figure 5F:
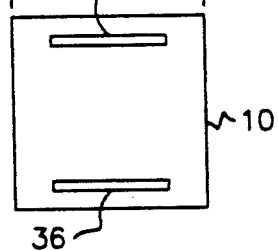
FIG. 5f is a partial plan view of a infrared sensitive bolometer element in accordance with the present invention.

IR sensitive element 10 is connected to matrix lines 38 and 40 as illustrated in FIG. 5e to provide a constant current I through element 10. Changes in the resistance of element 10 are sensed by a changing voltage transistor 14. The design of transistor or IC 14 and the forming of matrix lines 38 and 40 and the interconnection of element 10, IC 14 and the matrix system should be coordinated to reduce the number of separate process steps. Now that the method of making IR sensitive element 10 has been set forth many advantages can be further set forth and appreciated. In the past, the use of permalloy has made the bolometer fabrication process complicated due to the incompatibility of permalloy with most IC processes. The use of polysilicon in lieu of permalloy provides an advantage in that the polysilicon CVD process is easier to prepare and control then the permalloy sputtering process. The polysilicon process is also compatible with metal oxide semiconductor (MOS) processes.

Also, the polysilicon element of the present invention can withstand higher temperature processes than permalloy.

In addition, the polysilicon element of this present invention can be doped to achieve a wide range of resistivity by using arsenic, phosphorous or boron.

Polysilicon elements fabricated according to the present invention can also achieve a higher TCR than is available from permalloy.

In accordance with the foregoing description, Applicants' have developed a method of fabricating an infrared sensitive bolometer that utilizes doped polycrystalline silicon as the sensitive element. Although a specific embodiment of Applicants' method is shown and described for illustrative purposes a number of variations will be apparent to those of ordinary skill in the relevant arts. It is not intended that coverage be limited to the disclosed embodiment, but only by the terms of the following claims.

The embodiments of an invention in which an exclusive property or right is claimed are defined as follows:

1. A method of fabricating an infrared sensitive bolometer having an infrared sensitive element, comprising:
   providing a semiconductor substrate having a first insulating layer;
   depositing an oxide layer on said first insulating layer;
   masking and etching said oxide layer to form a remaining oxide region;
   depositing a first layer of polysilicon;
   masking and etching said first layer of polysilicon at said remaining oxide region;
   depositing a second layer of polysilicon;
   implanting ions into said second layer of polysilicon to achieve a predetermined temperature coefficient of resistance (TCR);
   masking and etching said second layer of polysilicon to define at least one opening in said infrared sensitive element;
   applying etchant through said at least one opening to remove said remaining oxide region and to form a cavity with said infrared sensitive element suspended over said cavity.

2. The method of claim 1 wherein said step of implanting ions into said second layer of polysilicon includes implanting ions of an element selected from the group including arsenic, phosphorous or boron.

3. The method of claim 2 wherein said step of implanting ions into said second layer of polysilicon includes implanting arsenic ions to achieve a TCR of about 1 to 2%/°C.

4. The method of claim 3 wherein said arsenic ions are implanted at an energy of about 60 KeV.

5. A method of fabricating a bolometer having an infrared sensitive element comprising:
   providing a semiconductor substrate;
   depositing an oxide layer on said semiconductor substrate;
   selectively removing a portion of said oxide layer to form a remaining oxide region;
   depositing a first layer of polysilicon;
   selectively removing said first layer of polysilicon at said remaining oxide region;
   depositing a second layer of polysilicon;
   implanting ions onto said second layer of polysilicon to achieve a predetermined temperature coefficient of resistance (TCR);
   defining at least one opening in said infrared sensitive element;
   applying etchant through said at least one opening to remove a substantial portion of said remaining oxide region to form a cavity with said infrared sensitive element suspended over said cavity.

6. The method of claim 5 wherein said step of implanting ions into said second layer of polysilicon includes implanting ions of an element selected from the group including arsenic, phosphorous or boron.

7. The method of claim 5 wherein said step of implanting ions into said second layer of polysilicon includes implanting ions to achieve a TCR of between about 1% per °C. and about 7% per °C.

8. The method of claim 6 wherein said step of implanting ions into said second layer of polysilicon includes implanting arsenic ions to achieve a TCR of about 1 to 2%/°C.

9. The method of claim 7 wherein said step of implanting ions into said second layer of polysilicon includes implanting arsenic ions to achieve a TCR of about 1 to 2%/°C.

10. The method of claim 9 wherein said arsenic ions are implanted at an energy of about 60 KeV.

* * * * *